United States Patent
Cioaca

(10) Patent No.: US 7,114,084 B2
(45) Date of Patent: Sep. 26, 2006

(54) DATA CONTROLLED PROGRAMMABLE POWER SUPPLY

(75) Inventor: Dumitru Cioaca, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 680 days.

(21) Appl. No.: 10/091,031

(22) Filed: Mar. 6, 2002

(65) Prior Publication Data

US 2003/0172309 A1    Sep. 11, 2003

(51) Int. Cl.
    *G06F 1/26*    (2006.01)
(52) U.S. Cl. .................. 713/300; 713/300; 713/323; 713/330; 327/148; 327/157; 327/526; 323/350
(58) Field of Classification Search .............. 713/300, 713/320, 324, 330, 323; 365/185.21, 185.25, 365/185.23, 226; 327/148, 157, 576, 5; 323/350
See application file for complete search history.

(56) References Cited

U.S. PATENT DOCUMENTS

| | | | | |
|---|---|---|---|---|
| 4,811,294 A | * | 3/1989 | Kobayashi et al. | 365/185.22 |
| 5,193,198 A | * | 3/1993 | Yokouchi | 327/536 |
| 5,291,446 A | * | 3/1994 | Van Buskirk et al. | 365/189.09 |
| 5,313,429 A | * | 5/1994 | Chevallier et al. | 365/226 |
| 5,313,499 A | * | 5/1994 | Coburn | 375/361 |
| 5,355,347 A | * | 10/1994 | Cioaca | 365/230.08 |
| 5,448,598 A | * | 9/1995 | Yousefi et al. | 375/376 |
| 5,493,249 A | * | 2/1996 | Manning | 327/540 |
| 5,784,315 A | * | 7/1998 | Itoh | 365/185.22 |
| 5,793,679 A | * | 8/1998 | Caser et al. | 365/185.27 |
| 5,870,295 A | * | 2/1999 | Watanabe | 363/60 |
| 5,991,197 A | * | 11/1999 | Ogura et al. | 365/185.11 |
| 6,009,022 A | * | 12/1999 | Lee et al. | 365/189.09 |
| 6,052,022 A | * | 4/2000 | Lee | 327/589 |
| 6,107,864 A | * | 8/2000 | Fukushima et al. | 327/536 |
| 6,137,345 A | * | 10/2000 | Kaneko et al. | 327/538 |
| 6,337,595 B1 | * | 1/2002 | Hsu et al. | 327/538 |
| 6,348,886 B1 | * | 2/2002 | Frank et al. | 341/144 |
| 6,404,274 B1 | * | 6/2002 | Hosono et al. | 327/538 |
| 6,421,297 B1 | * | 7/2002 | Huber | 365/230.06 |
| 6,507,237 B1 | * | 1/2003 | Hsu et al. | 327/538 |
| 6,512,801 B1 | * | 1/2003 | Ninomiya | 375/316 |
| 6,653,888 B1 | * | 11/2003 | Lee | 327/534 |
| 6,771,729 B1 | * | 8/2004 | Takahashi et al. | 375/376 |
| 2002/0175745 A1 | * | 11/2002 | Kim | 327/536 |
| 2002/0196035 A1 | * | 12/2002 | Cho | 324/678 |

\* cited by examiner

*Primary Examiner*—Lynne H. Browne
*Assistant Examiner*—Nitin C. Patel
(74) *Attorney, Agent, or Firm*—Dickstein Shapiro LLP

(57) ABSTRACT

A power supply, and a method of controlling the power supply, in which more or less power capacity of the power supply is activated depending on the state of a digital data signal on a data bus. The power supply has a control circuit which detects the number of "zero" bits present on the data bus, and responsively activates one or more of a plurality of power supply circuits such as charge pump circuits. The outputs of the charge pump circuits are mutually connected to a driver adapted to program memory cells of a flash memory circuit.

19 Claims, 13 Drawing Sheets

DATA CONTROLLED PROGRAMMABLE POWER SUPPLY

FIELD OF THE INVENTION

The present invention relates to a power supply control, and more particularly to a power supply control that controls a charge pump by sensing a digital signal and controlling an output of the charge pump in relation to the digital signal.

BACKGROUND OF THE INVENTION

To program the memory cells of a memory integrated circuit, electrical power is applied to the cells. The electrical power is applied to the cells at a particular voltage, and this voltage must be maintained at a relatively stable value regardless of the current demand placed on the power supply. In practice, maintaining a stable power supply voltage can be difficult. Depending on the number of memory cells being programmed at any particular time, the current demand placed on the power supply can vary substantially. For example, the maximum drain current required for programming of a typical flash memory cell is 300 microamps. For flash memories organized by 16, the required current capability of a programming power supply is 4.8 milliamps (16×300 microamps). A charge pump with a 4.8 milliamp current capacity works well for words where the majority of bits are programmed. However, a 4.8 milliamp power supply is too powerful for words where only a few bits are programmed, causing a resulting voltage overshoot on the drains of the flash cells. If many cells are being programmed to a particular logic state (for example a "zero" state), a correspondingly large current is required. If only a few cells are being programmed to the same logic state, a relatively small current is required. If a power supply supplying the programming current has insufficient current capacity, there is a tendency for programming voltage to drop. Consequently, programming may occur undesirably slowly and/or one or more memory cells may be programmed into an incorrect state.

Charge pumps are commonly used to provide programming current to flash memory cells. Charge pump efficiency is optimized when the pump is operating at or near full capacity. Thus, if a charge pump is sized to provide proper programming for a maximum number of memory cells, efficiency will be reduced when a data word requires that only a few cells be programmed. Consequently, it would be useful to have a power supply that is efficient when controlled to maintain a desirable voltage and which supplies a proper level of current for the number of memory cells to be programmed.

In one conventional power supply, feedback control is used to stabilize output voltage. Under feedback control, the voltage or current being output from a power supply is measured and the power supply is adjusted in accordance with a deviation of the measured value from a desired value. In one conventional method, the adjustment of the power supply is effected by including capacitance at the output of the power supply and switching the power supply on and off in relation to a voltage measured on the capacitance. When the power supply is based on a charge pump, such switching on and off tends to lower the efficiency of the power supply, because capacitive charge pump efficiency is diminished during a startup period that immediately follows switching on of the charge pump. Also, switching on and off of a power supply may introduce undesirable harmonic frequencies on the output of the power supply. These harmonic frequencies may diminish data integrity and increase system power dissipation. Finally, feedback control implies a trade-off between sensitivity of control and stability. A stable system will lag demand variations resulting in some level of voltage overshoot despite the control.

Accordingly, it would be desirable to have a control method and apparatus for providing power to a memory integrated circuit device where the power is provided at desirable levels of voltage and current while minimizing the disadvantages noted above.

SUMMARY OF THE INVENTION

According to the present invention, a power supply is provided with a plurality of power supply circuits. Each power supply circuit includes a charge pump circuit. The power supply also includes a control circuit. A data bus having a plurality of data lines is connected to, and monitored by, the control circuit. The control circuit detects a data signal including a plurality of data bits on the data bus. Each data bit of the data signal has a particular state. Generally, the data bits have either a "one" state or a "zero" state. The power output by the power supply is changed by the control circuit depending on the states of the data bits. For example, programming a single memory cell to a "zero" state at a particular time requires a small current (300 μA). Programming N cells to a "zero" state at a particular time requires a current of a single cell multiplied by the member N. If the data bus has a bit configuration 1000100010001000, only the twelve cells corresponding to "0" will require programming current. Thus when there are twelve cells to be programmed the current needed will be 12×300 μA. The cells corresponding to a "one" on the data bus will keep the "one" state given to all the flash cells during the block erase operation performed in advanced of a programming operation. During the erase operation all cells are erased to show data "one". During a programming operation only the cells corresponding to a "zero" on the data bus will need current to change their "one" status given to them by the erase operation to a "zero" status required by the "zero" on the data bus. According to one aspect of the invention, the power supply circuit is adjusted by feeding forward a signal corresponding to the number of "zero" data bits detected on the lines of the data bus at a particular time.

Preferably, the power supply of the present invention includes multiple power supply circuits. One or more of the power supply circuits are activated at a particular time depending on the number of "zero" bits to be programmed. One of the multiple power supply circuits is activated by enabling that portion of the power supply. Activating a portion of the power supply is accomplished by applying a clock signal to that portion of the power supply. Alternately, one of plural power supply circuits may be enabled by connecting input power to the one power supply circuit. In yet another alternative embodiment of the invention, a portion of the power supply is activated by switchingly connecting that portion of the power supply to a load which includes one or more data buffers and/or memory cells. Accordingly, in one aspect, the invention includes detecting a number of "zero" data bits on a serial or parallel data bus, and according to that number of "zero" data bits, enabling a clock circuit and clocking one or more charge pump sub-circuits of a power supply so as to supply an appropriate current to a plurality of buffers, and thereby to a plurality of memory cells adapted to be programmed according to the data pattern on the data bus.

These and other aspects and features of the invention will be more clearly understood from the following detailed description which is provided in conjunction with the accompanying drawings.

DETAILED DESCRIPTION OF THE PREFERRED EMBODIMENTS

Figure 1:
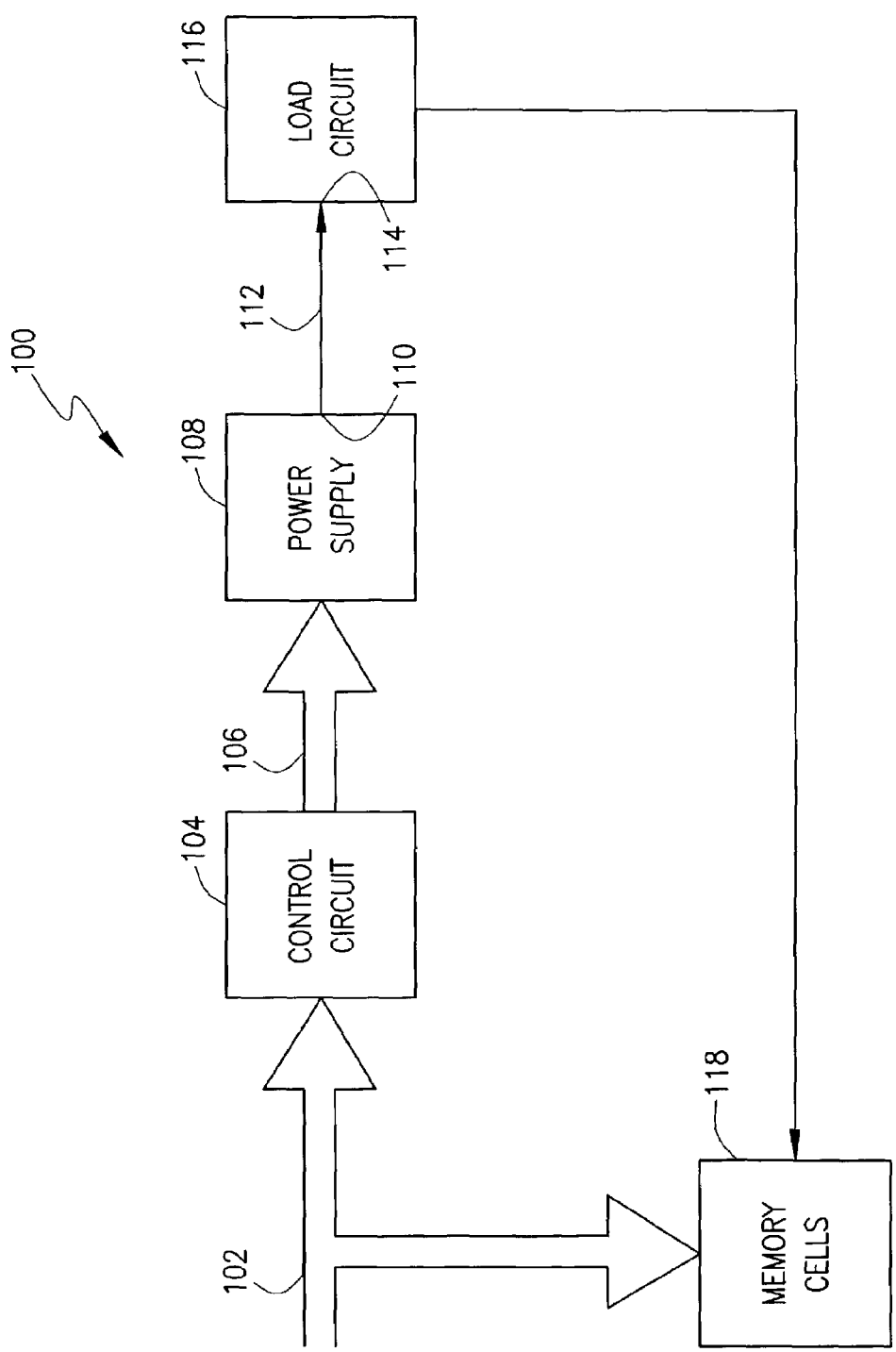
FIG. 1 shows a first aspect of the invention, in block diagram form.

FIG. 1 shows the data controlled power supply 100 of the present invention in block diagram form. A data bus 102 is operatively connected to a control circuit 104. The control circuit 104 is adapted to output a control signal on a control bus 106. The control signal on the control bus 106 varies depending on a number of data bits on the data bus 102 in a "zero" state at a particular time. The control bus 106 is operatively connected to a power supply circuit 108. The power supply circuit 108 is adapted to provide a particular level of current and/or voltage to an output 110 of the power supply circuit depending on the control signal transmitted over the control bus 106. Depending on the conditions at the output 110 of the power supply circuit 108, an output current is conducted over a conductor 112 operatively connected between the output 110 of the power supply circuit and an input 114 of an electrical load 116. In one aspect of the invention the electrical load 116 is a buffer circuit operatively connected to an array of memory cells 118.

In operation, a particular data pattern of "ones" and "zeros" is presented on the data bus 102. The control circuit 104 responds to the data pattern by sending a corresponding signal over the control bus 106 to the power supply circuit 108. As will be described below with reference to various illustrative embodiments, the power supply of the invention responsively provides a particular level of power to an electrical load 116.

Figure 2:
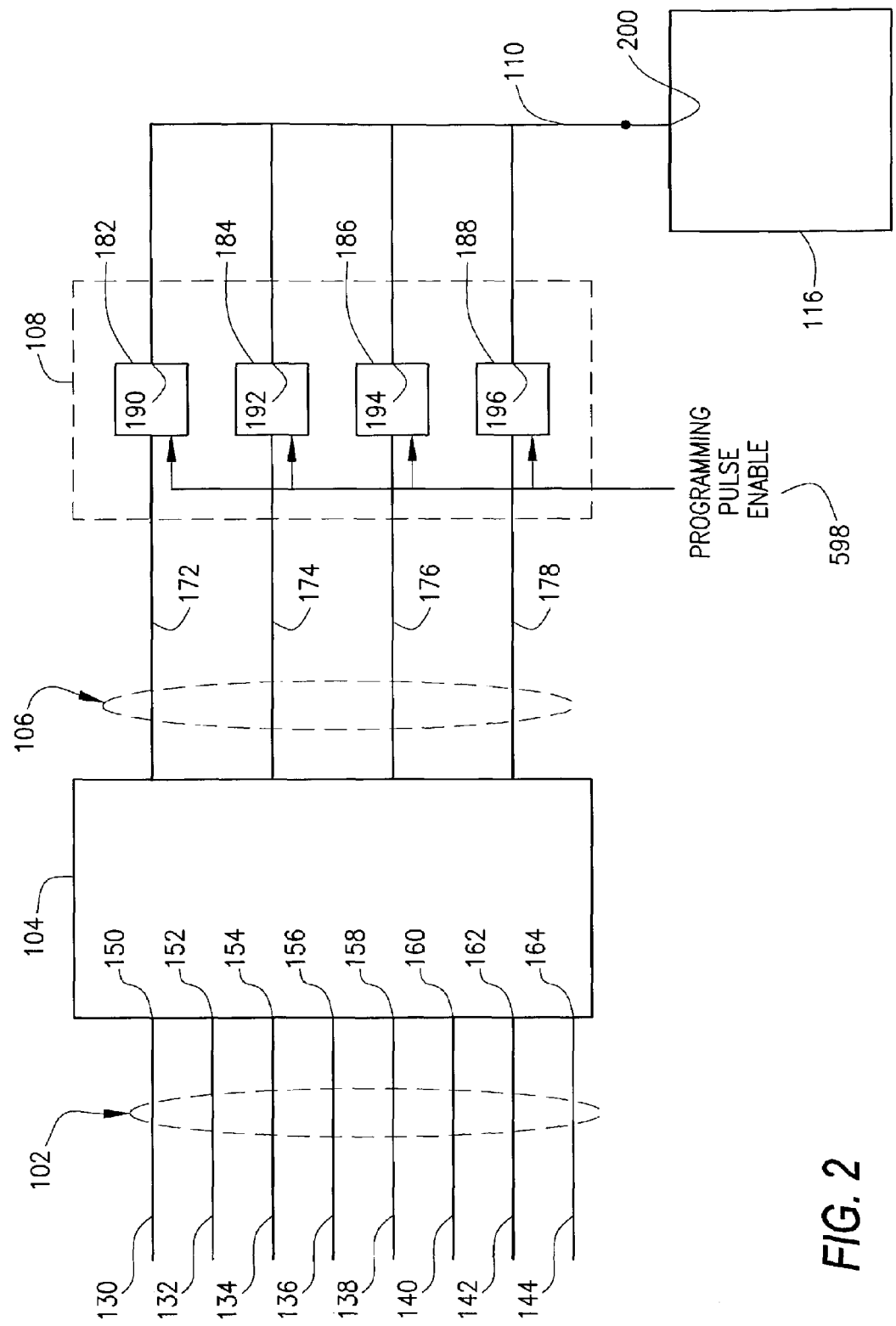
FIG. 2 shows a further aspect of the invention including a power supply circuit having four separate charge pump circuits.

In FIG. 2, the data bus 102 is shown to include a plurality of data lines 130, 132, 134, 136, 138, 140, 142, and 144. The data lines of the data bus are operatively connected to a respective plurality of data inputs 150, 152, 154, 156, 158, 160, 162, and 164 of the control circuit 104. The control bus 106 includes four control lines 172, 174, 176, and 178. Each control line 172–178 of control bus 106 is operatively connected from the control circuit 104 to a respective charge pump circuit 182, 184, 186, and 188 of the power supply circuit 108. The four charge pump circuits each include a respective output 190, 192, 194, and 196. These outputs are mutually connected to an input 200 of an electrical load 116. At any given time, each control line 172–178 transmits a control signal occupying one of two binary states. That is, each control line transmits a "one" or a "zero". If the control line signal is "one", the charge pump circuit to which that control signal is connected is enabled, and that charge pump circuit supplies power to its respective output. If the control line signal is "zero", the respective charge pump circuit is inactive and does not supply power to its output.

In one embodiment of the invention, the power supply is adapted to program a 16 bit data word into a flash memory array. The four identical pumps are each capable of delivering the current necessary to program a maximum of four flash cells (4×300 microamps equals 1.2 milliamps). The first pump and its clock generator 182 are activated during every programming and reprogramming pulse by a Programming Pulse Enable Signal 598. The second pump 184 is activated only if more than four data are to be programmed during the programming cycle. The third pump 186 is activated only if more than eight data are to be programmed during a programming or reprogramming cycle. The fourth pump 188 is activated only if the number of data to be programmed or reprogrammed is higher than 12.

Figure 3:
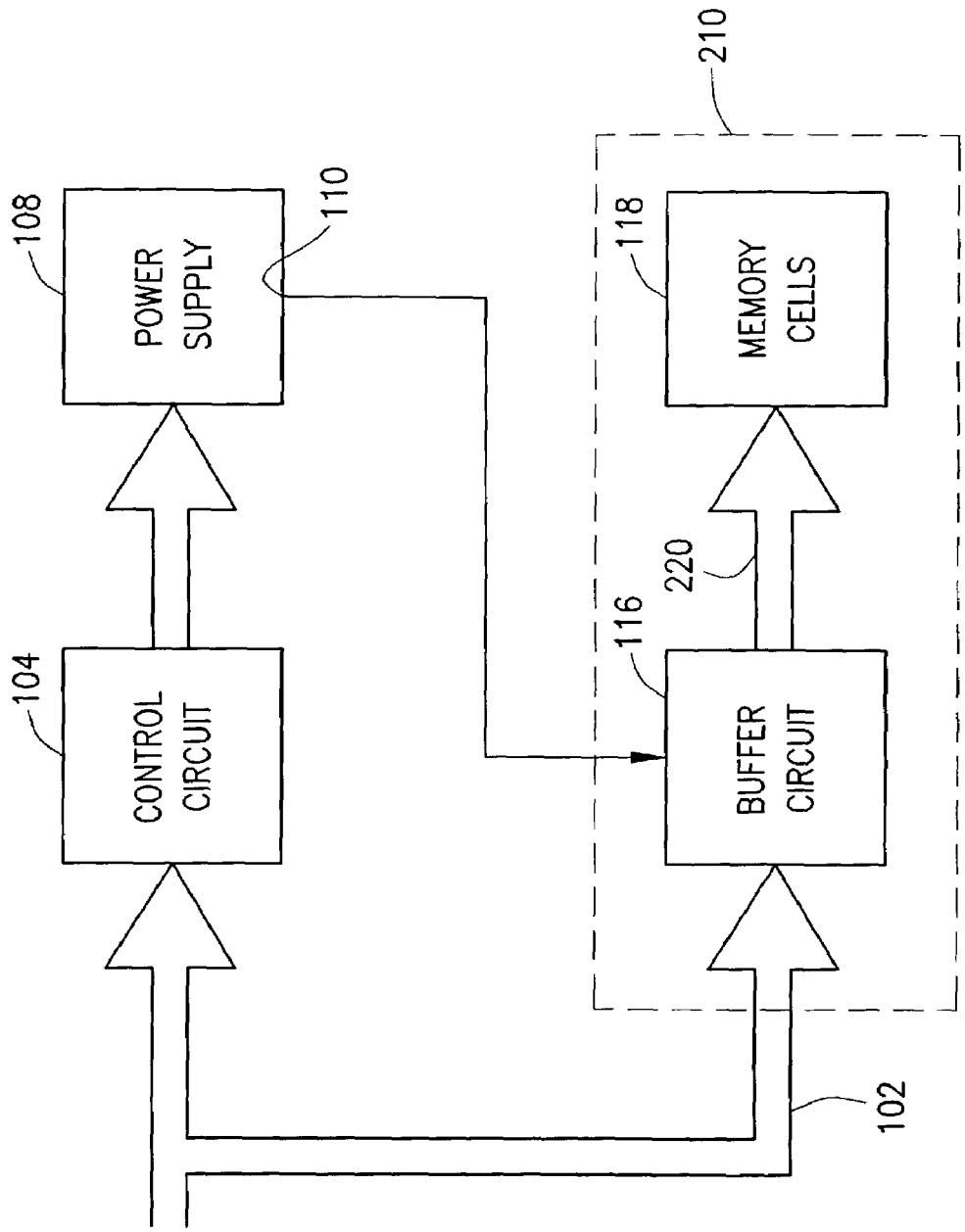
FIG. 3 shows a further aspect of the invention including an electrical load having a buffer circuit and an array of flash memory cells.

FIG. 3 shows an alternative embodiment of the invention in which the power output by the power supply 108 is applied to an electrical system that includes a flash memory integrated circuit 210 having a buffer circuit 116, an internal data bus 220, and an array of flash memory cells 118. According to the embodiment shown, power from the power supply 108 is conducted from the output 110 of the power supply to the buffer circuit 116. There, the power is used to amplify incoming data signals from the data bus 102. The incoming data signals are then output from the buffer 116 over the internal data bus 220 to the flash memory array 118. There, the power supplied by the power supply 108 is used to program the flash memory cells into particular memory states according to the state of the data bus 102.

Figure 4:
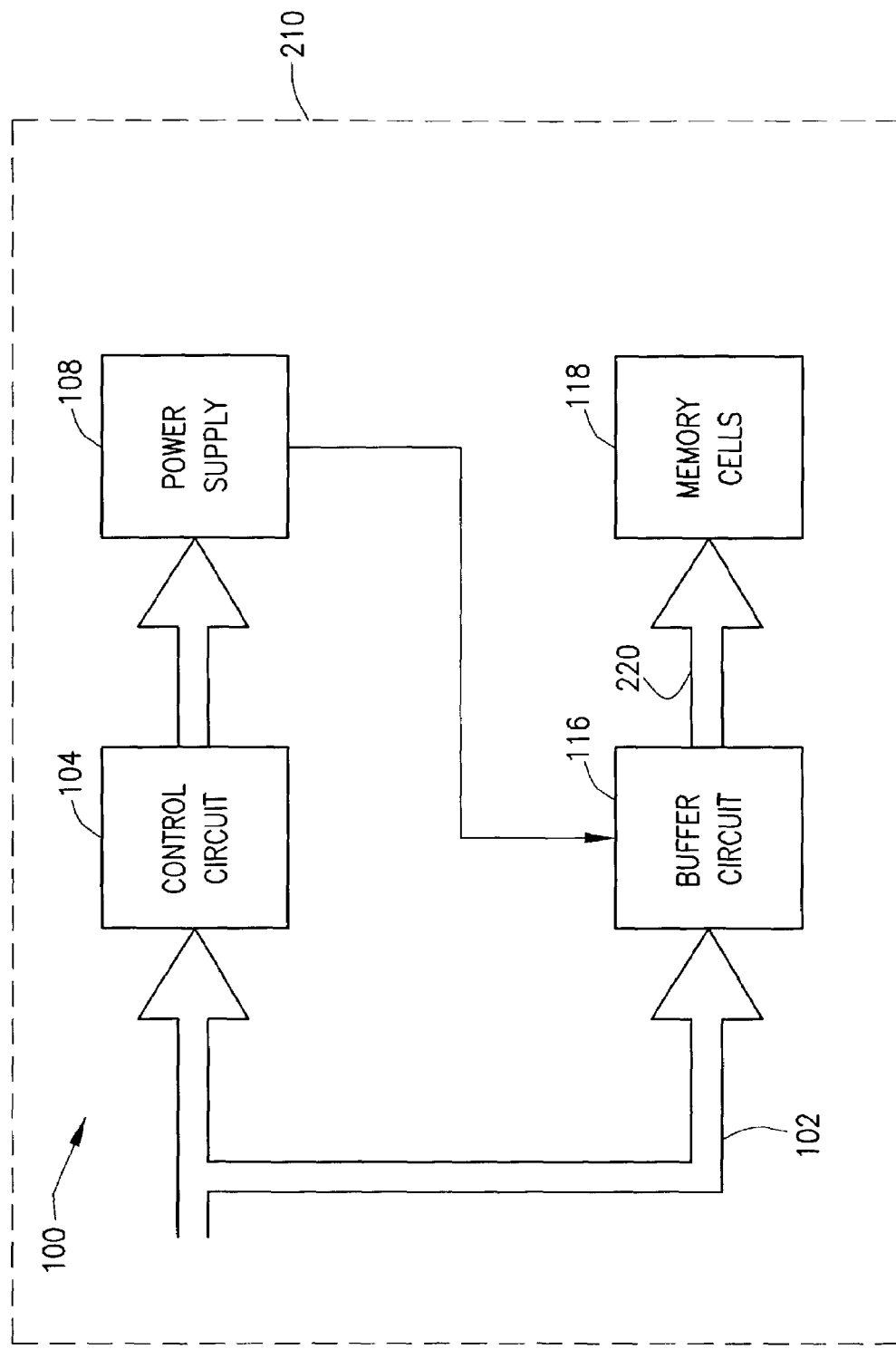
FIG. 4 shows a further aspect of the invention including an electrical load having a buffer circuit and an array of flash memory cells integrated on a single integrated circuit.

FIG. 4 illustrates a system that is functionally similar to that of FIG. 3, but that differs from the system of FIG. 3 in that the controlled power supply 100, including control circuit 104 and charge pump power supply 108 are entirely implemented on the integrated circuit 210 bearing the flash memory array 118.

Figures 5, 5A, 5B:
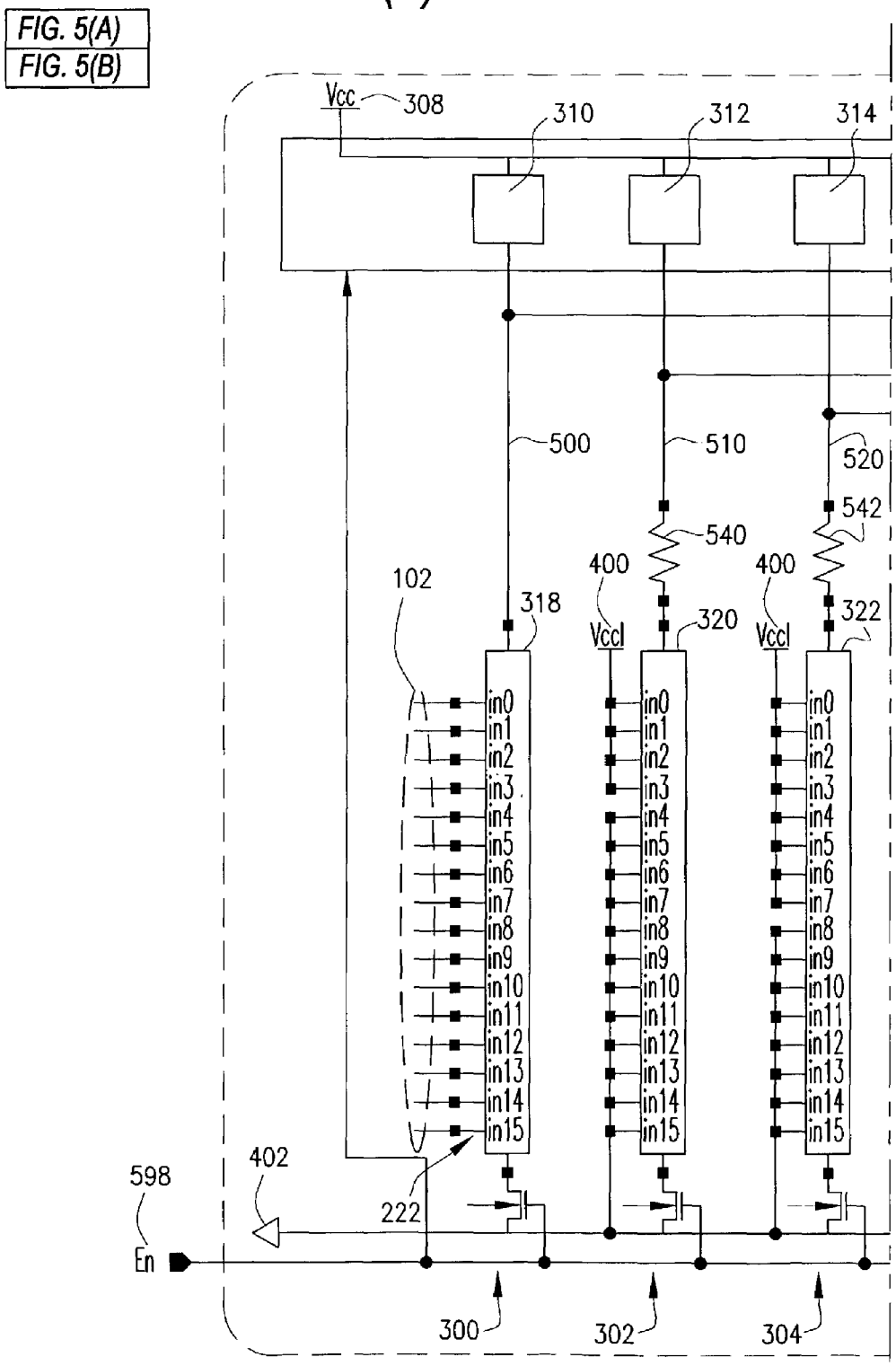
FIG. 5 shows an aspect of the invention including an analog control circuit and a plurality of charge pumps.
Figure 5B:
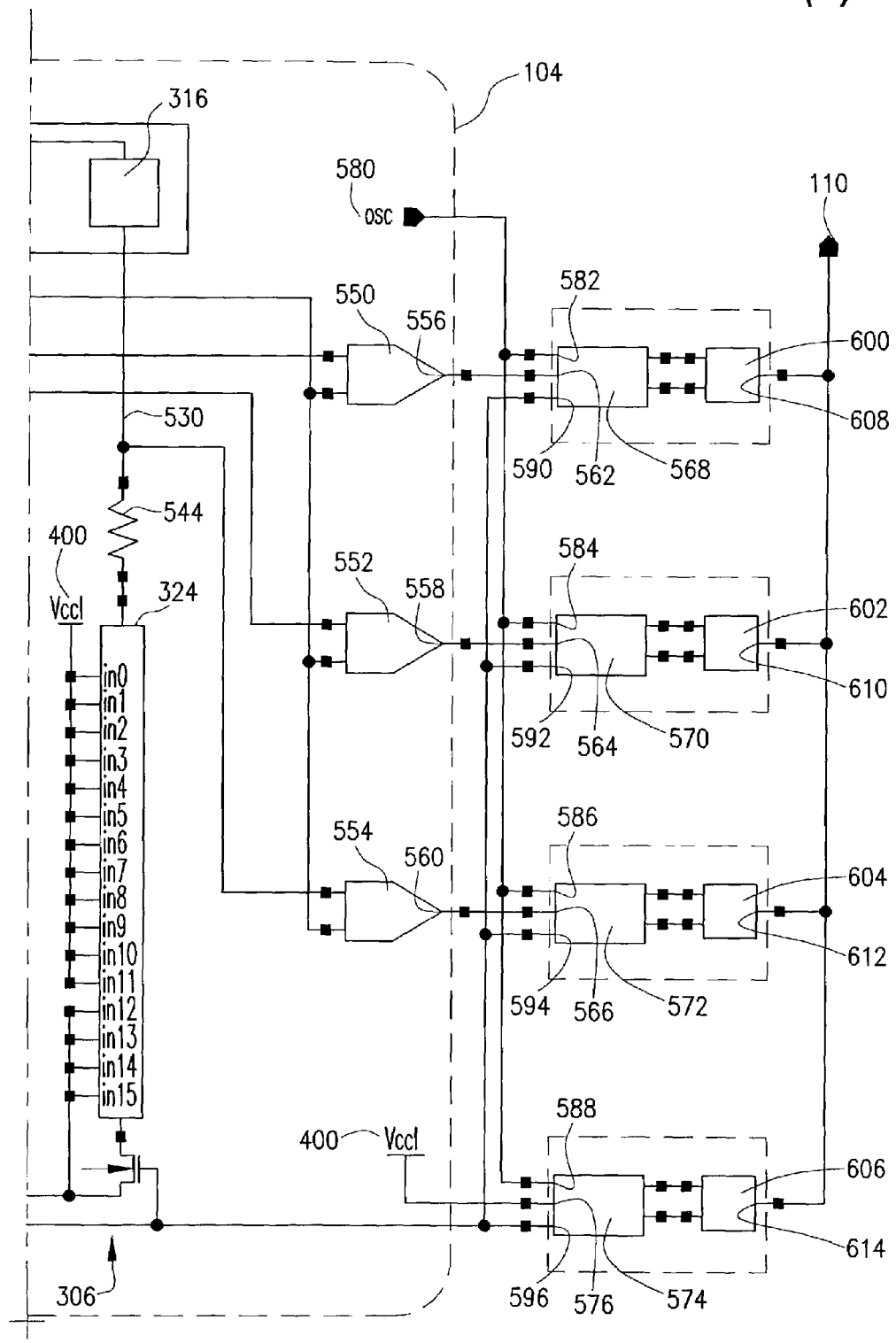

FIG. 5 illustrates a particular control circuit including an analog portion along with respective connections to a plurality of charge pump circuits. The control circuit of FIG. 5 operates by varying an analog voltage signal according to a number of "zero" bits on a data bus. The analog voltage signal is compared to a plurality of reference voltages and a particular number of charge pump circuits are activated depending on the outcome of the comparison. As shown, the control circuit 104 includes four voltage dividers 300, 302, 304, and 306 powered by a common input voltage VCC 308. Each voltage divider includes a respective fixed resistance (or a current source) 310, 312, 314, 316 and a respective programmable resistance 318, 320, 322, and 324. Three of the programmable resistance elements 320, 322, 324 are permanently programmed to respective fixed resistances. The other programmable resistance element is connected at a plurality of data inputs 222 to the data bus 102.

Figure 6:
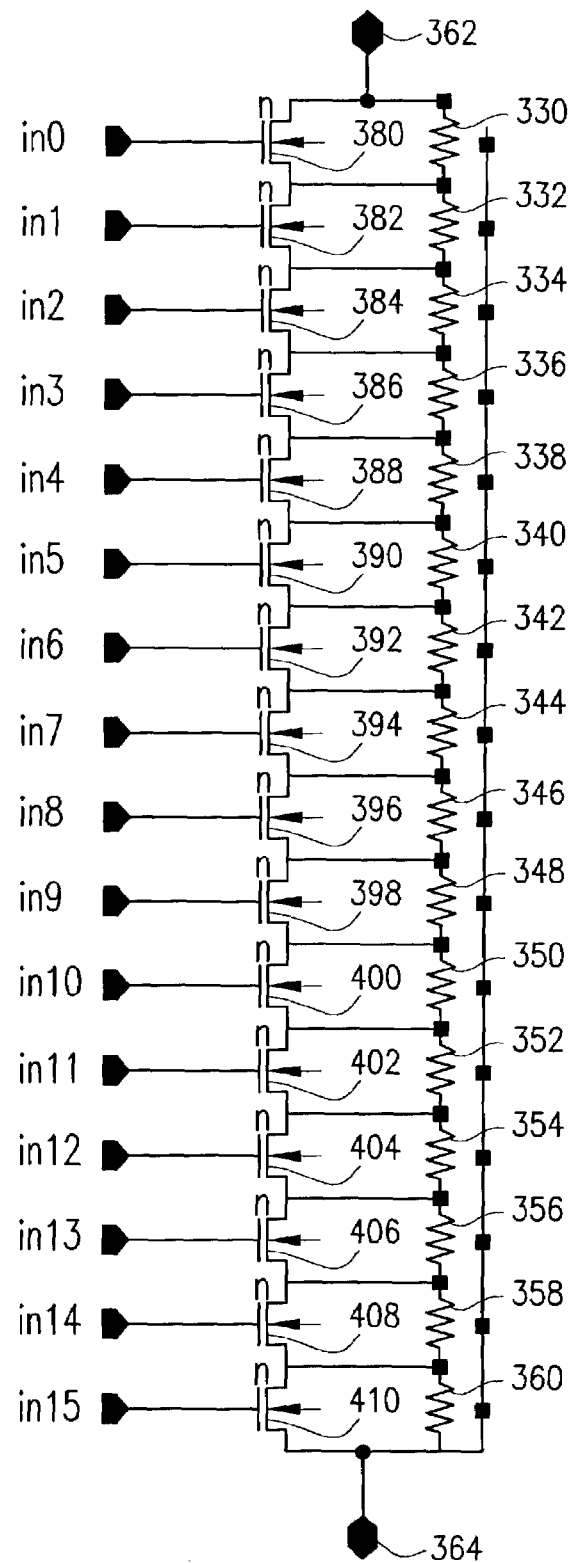
FIG. 6 shows a programmable resistance element according to the invention.

A structure typical of the programmable resistance elements 318–324 is shown in more detail in FIG. 6. The programmable resistance element includes a plurality of resistors 330–360 connected between a first terminal 362 and a second terminal 364. In a preferred embodiment of the invention, each of the resistance element resistors 330–360 has an individual resistance of approximately 10 K-Ohm. Each resistor 330–360 is shunted by respective transistor 380–410. The respective gates of the plurality of transistors 380–410 act as programming inputs of the programmable resistance element. When a signal of the correct potential is applied at one of the gates, the respective transistor (otherwise non-conductive) becomes conductive, and the respective resistor that it shunts is bypassed. Thus, the resistance of the programmable resistance element depends on the number of conductive transistors 340–410 at any given time, and therefore on the values applied to the inputs of the programmable resistance element.

Referring again to FIG. 5, resistance element 320 is permanently wired so as to program its output resistance to a fixed value. As shown, inputs 0–3 are connected to a source of voltage vcc1 400. Inputs 4–15 are grounded. Accordingly, the first four transistors 380–386 are conductive, and the first four resistors 330–336 of the resistance element are shunted. Since the gates of the balance of the transistors of the resistance element 320 are connected to ground 402, the transistors are non-conductive. Thus, the resistance of the programmed resistance element equals the series resistance of resistors 338–360.

In a similar fashion, resistance element 322 is programmed by permanent connection of some of the transistor gates to vcc1 400 and other of the transistor gates to ground 402. In the case of resistance element 322, resistors 330–344 are shunted, and the resistance of the programmed resistance element is equal to the series connection of resistors 346–360. In the case of resistance element 324, resistors 330–352 are shunted, and the programmed resistance of the resistance element is equal to the series resistance of resistors 354–360. The consequence is that, when a standard voltage VCC 308 is applied across the series combinations of resistor 316 with resistance element 324, resistor 314 with resistance element 322, and resistor 312 with resistance element 320, three reference voltages are produced at the common nodes 510, 520, and 530 between the resistors and respective programmable resistance elements. As illustrated, additional resistors 540, 542, and 544 each exhibit about one-half (5 K-Ohm) the resistance of the programmed resistance element resistors, e.g., 330, and are shown connected in series with the resistance element. Resistors 540, 542, and 544 serve to offset the reference voltages at nodes 510, 520, and 530 respectively by one-half bit value. This voltage offset serves to clearly separate the reference voltage from the voltage produced by any stable combination of input bits on data bus 102. As would be understood by one of skill in the art, this prevents oscillation of comparators 550, 552, and 554 respectively.

Unlike the permanently programmed resistance elements 320–324, resistance element 318 exhibits a resistance that is a function of the number of "zero" bits on the data bus 102 connected to its respective inputs. Accordingly, the voltage apparent at node 500 varies according to the data on the data bus 102. The voltage on node 500 is compared with the three reference voltages on nodes 510, 520, and 530 respectively by three respective analog comparators 550, 552, and 554. Each comparator 550, 552, and 554 has a respective output 556, 558 and 560 connected respectively to three enable inputs 562, 564, and 566 of three respective timing circuits 568, 570, and 572. A fourth timing circuit 574 has an enable input 576 that is permanently connected to vcc1 400. The fourth timing circuit 574 is therefore enabled independently of the state of the data bus 102. The four timing circuits 568–574 receive an oscillator signal 580 at respective oscillator inputs 582, 584, 586, and 588. As shown, the four timing circuits also include four further enable signal inputs 590, 592, 594, and 596 connected to a source of an enable signal 598. As shown, each timing circuit includes two outputs connected respectively to two corresponding inputs of a respective charge pump circuit 600, 602, 604, and 606 for driving the charge pumps, as would be understood by one of skill in the art. The charge pump circuits 600, 602, 604, and 606 have respective outputs 608, 610, 612, and 614. According to the aspect of the invention shown in FIG. 5, these respective outputs 608–614 are mutually connected to an output 110 of the power supply 100.

While FIGS. 5 and 6 illustrate a control circuit employing resistance elements and analog comparators to determine which charge pump circuits will be active, and which will be inactive, at any given time, one of skill in the art would understand that it would be routine to implement a control circuit using combinational logic, and digital signals exclusively, to achieve control of the charge pumps according to the invention.

Figures 7, 7A, 7B:
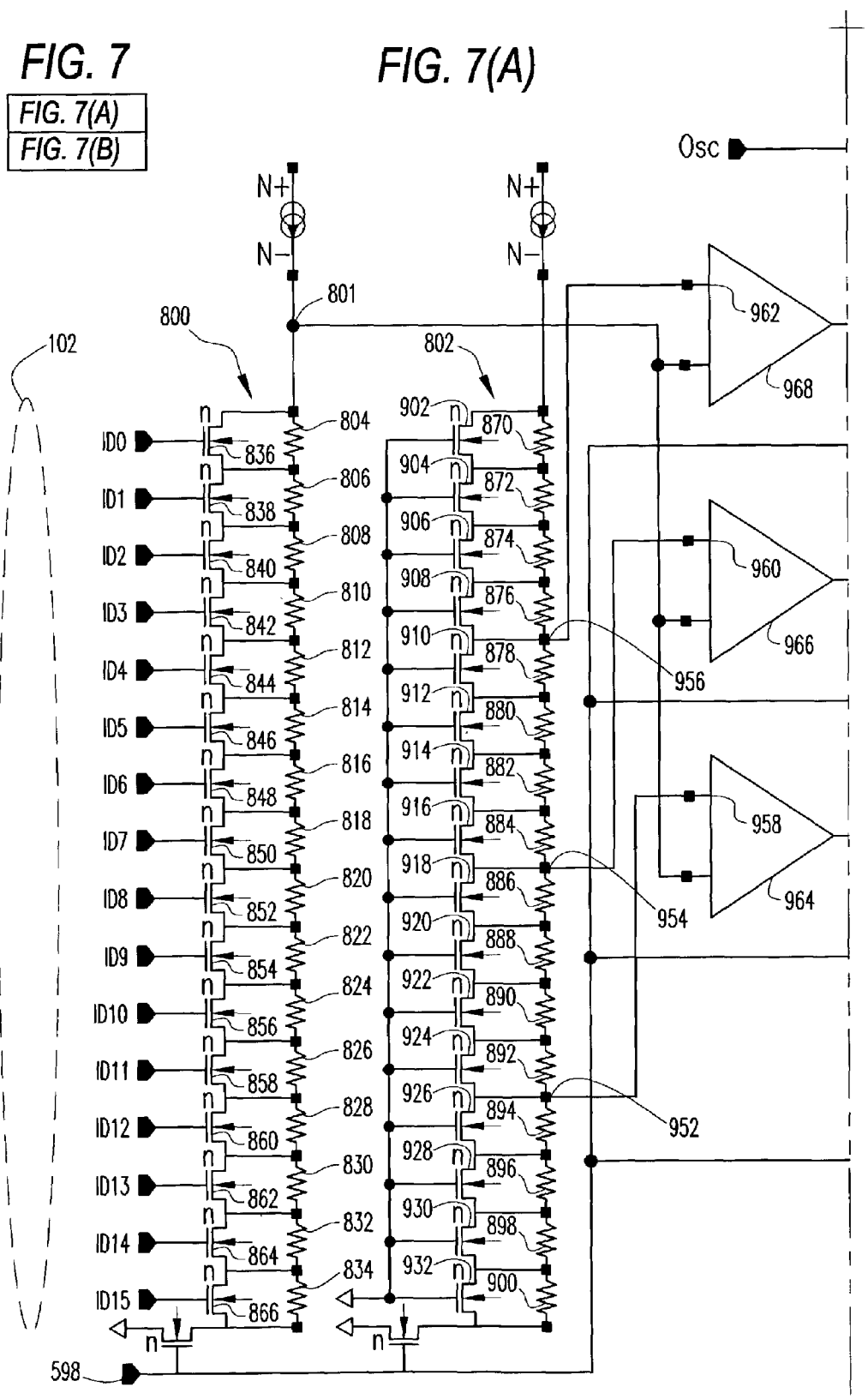
FIG. 7 shows a further aspect of the invention including a control circuit implemented with two programmable resistance elements.
Figure 7B:
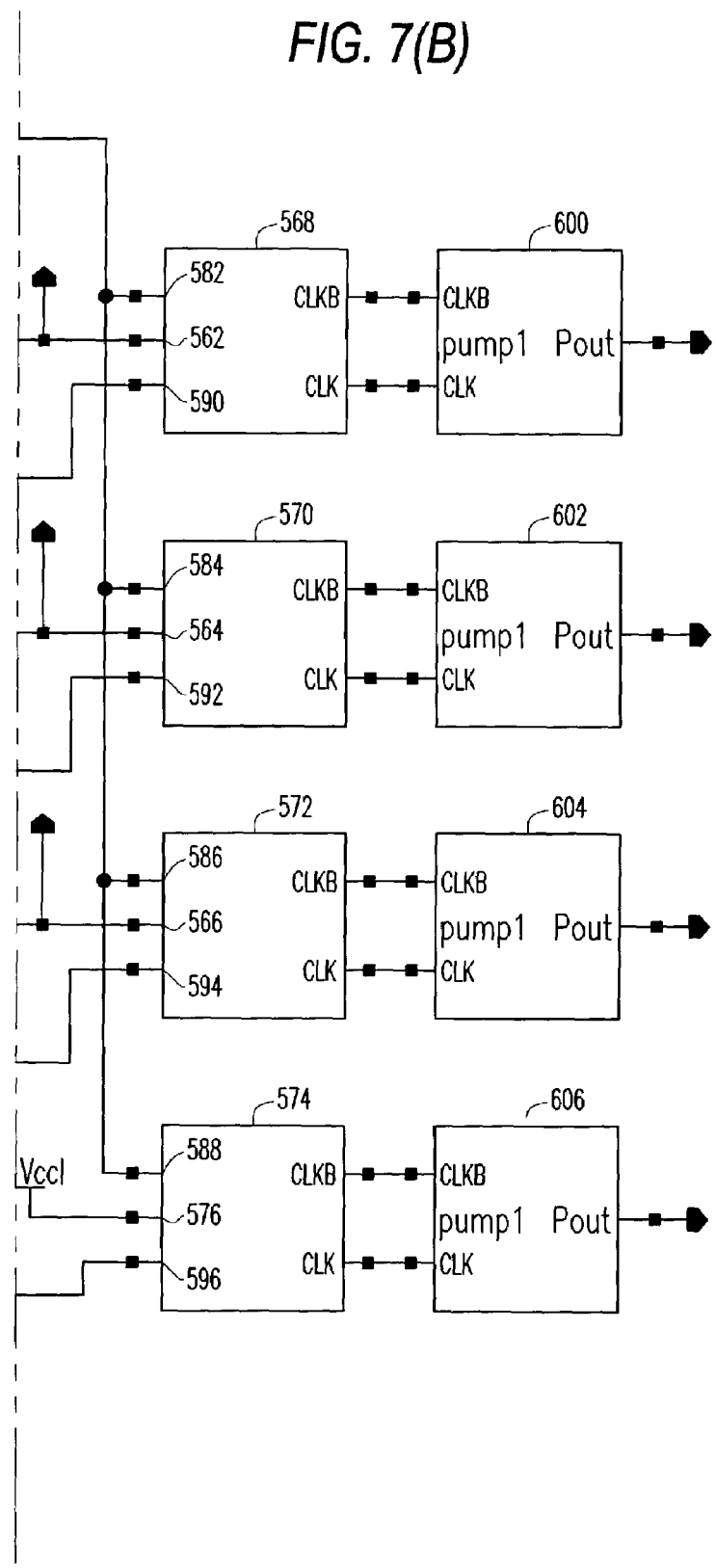

FIG. 7 shows a further embodiment of the invention in which a single programmable resistance element is employed to produce three separate reference voltages. The three reference voltages are then applied to three comparators respectively in the manner described above with respect to the circuit of FIG. 5. Accordingly, FIG. 7 shows a first programmable resistance element 800 and a second programmable resistance element 802. The first resistance element 800 has a plurality of resistors 804–834, shunted by a respective plurality of transistors 836–866. The transistors 836–866 are controlled by a respective plurality of gates that are connected to the data bus 102 in the fashion described above with respect to the circuit of FIG. 5. The second resistance element 802 has a plurality of resistors 870–900, shunted by a respective plurality of transistors 902–932. The transistors 902–932 are controlled by a respective plurality of gates that are mutually grounded, making all of the transistors non-conductive. Reference voltages are tapped from the series connected resistors 870–900 at three nodes 952, 954, and 956 and applied to respective inputs 958,960, and 962 of respective analog comparators 964,966, and 968. In other aspects, the circuit illustrated in FIG. 7 is structured and operates similarly to the description provided above with respect to FIG. 5. The numbering of the additional circuit elements corresponds to that found in FIG. 5.

It should be noted that while FIGS. 2, 5, and 7 each show power supply circuits including four charge pump circuits and associated controls, the selection of a particular type, number, or configuration of power supply circuits is a matter of design choice.

Figure 8:
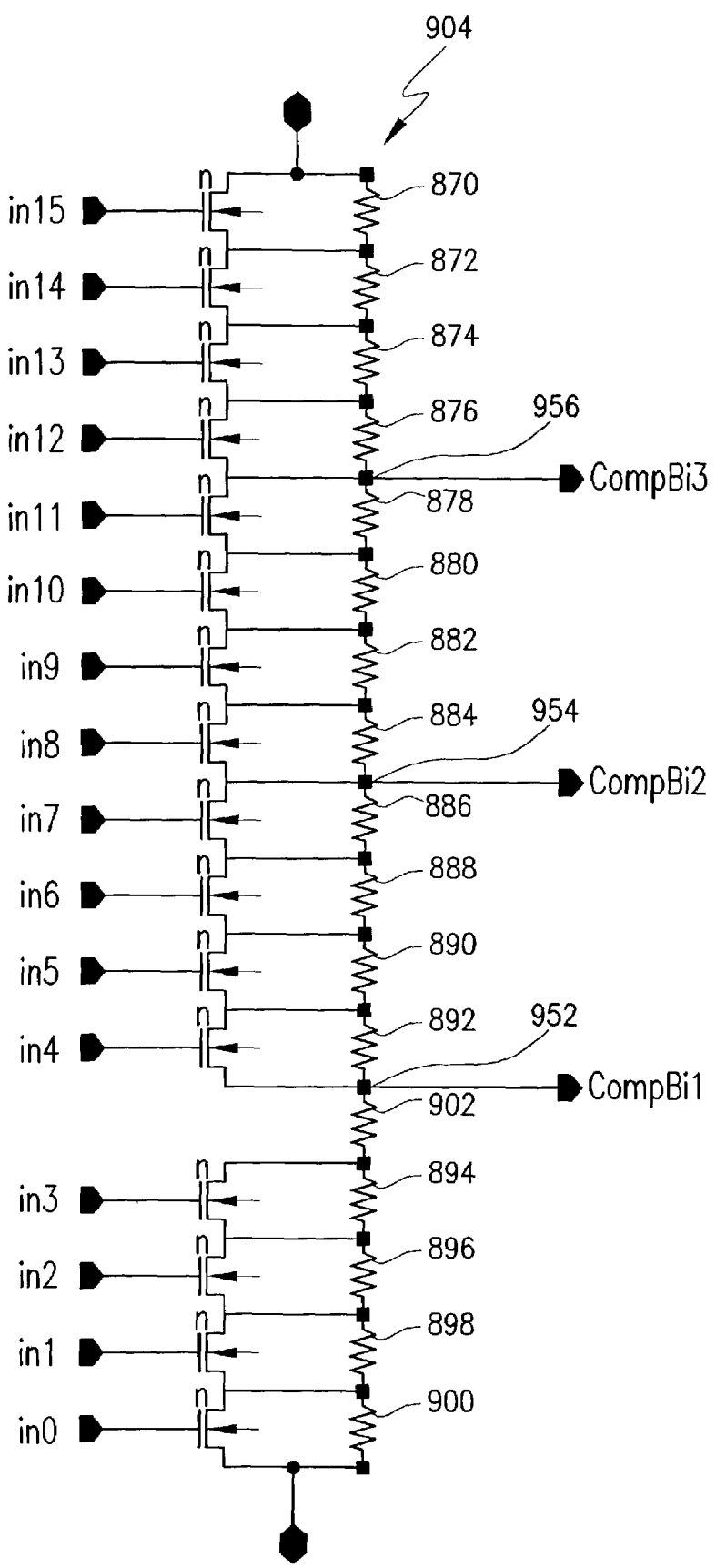
FIG. 8 shows an alternative programmable resistance element according to a further aspect of the invention.

FIG. 8 shows an alternative programmable resistance element 904 used to generate three reference voltages in place of the programmable resistance element 802 of FIG. 7. As shown in FIG. 7, the three reference voltages are tapped out of the programmable resistance element at three respective nodes 952, 954, and 956. Node 952 is located at the mutual connection of resistors 892 and 902; node 954 is located at the mutual connection of resistors 884 and 886, and node 956 is located at the mutual connection of resistors 876 and 878. As shown in FIG. 8, an additional resistor 902 is disposed in the resistance stack of the programmable resistance element 904. This additional resistor 902 has one-half the resistance value of the other resistors in resistance element 904 and serves to raise each of the three reference voltages by a magnitude equal to one-half bit. This additional voltage increment serves to insure that a voltage measured at node 801 at the top of resistance element 800 is clearly different from each reference voltage, regardless of the digital signal present on the data bus 102. Consequently, the additional resistor 902 serves to prevent unwanted oscillations at the outputs of the comparators 964–968.

Figures 9, 9A, 9B:
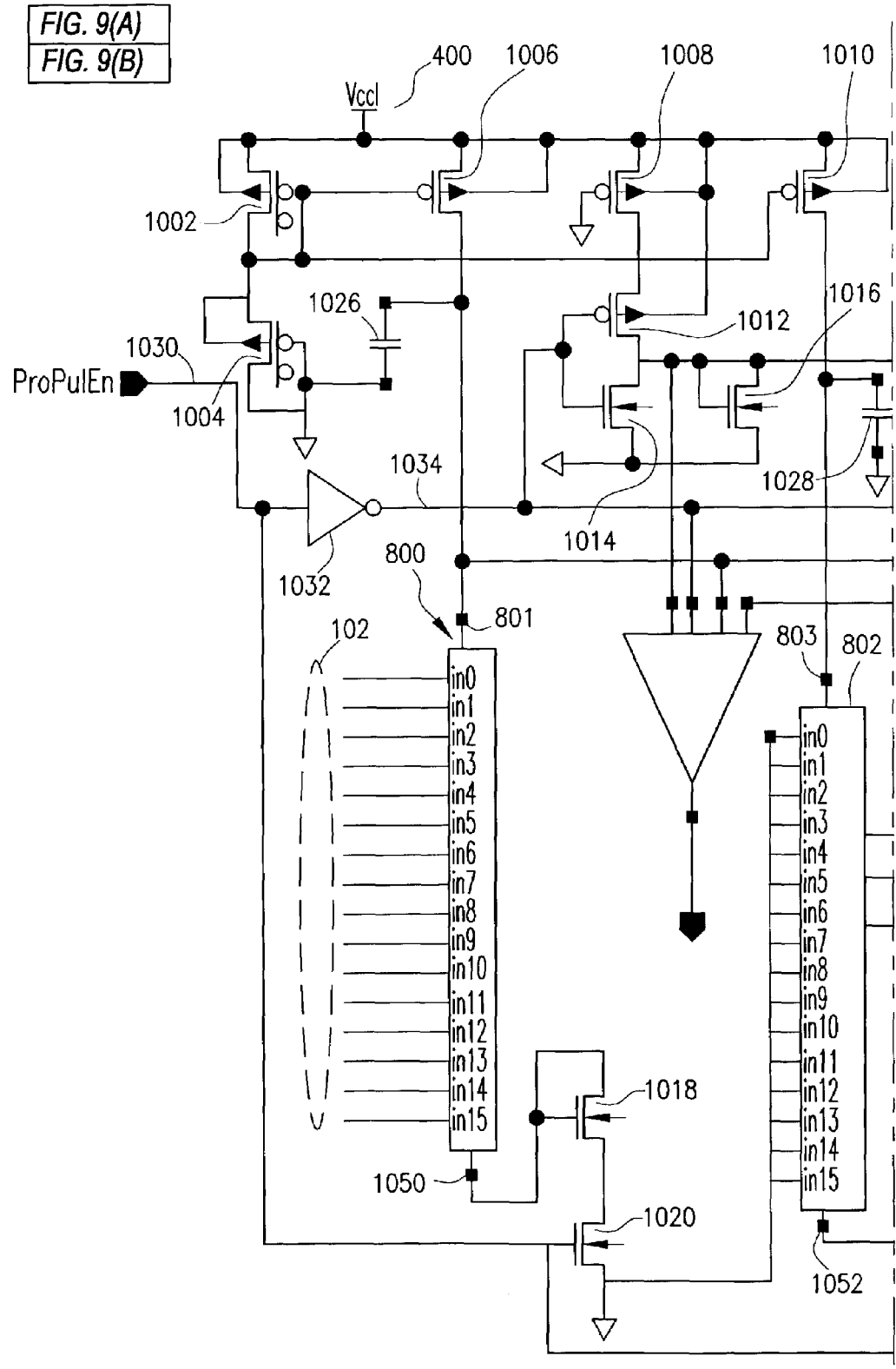
FIG. 9 shows current source circuitry according to one aspect of the invention.
Figure 9B:
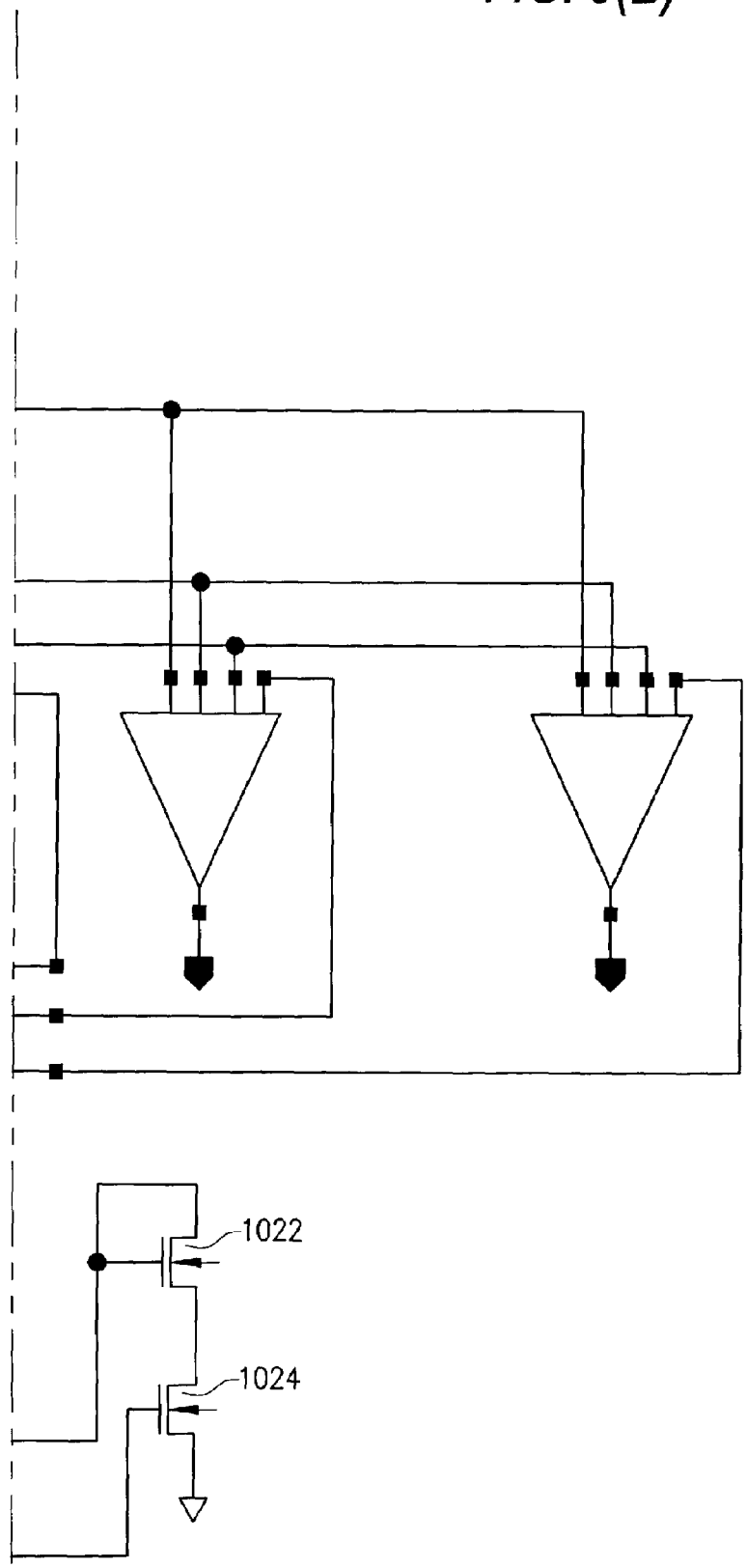

FIG. 9 shows a circuit similar to that of FIG. 7, with the programmable resistance elements shown in block diagram form, and one embodiment of the current sourcing portions of the circuit shown schematically in additional detail. FIG. 9 shows the circuitry that applies and controls the current that flows through programmable resistance elements 800 and 802. Six P-type transistors are shown as transistors 1002, 1004, 1006, 1008, 1010, and 1012. Six N-type transistors are shown as transistors 1014, 1016, 1018, 1020, 1022, and 1024. The respective sources of transistors 1002, 1006, 1008, and 1010 are all connected to a common node at vccl 400. Also connected to vccl are the substrates of transistors 1002, 1006, 1008, 1010, and 1012. The gate of transistor 1002 is connected to its own drain, to the gate of transistor 1006, and to the gate of transistor 1010. The drain of transistor 1002 is connected to both the source and the substrate of transistor 1004. The gate of transistor 1004 is grounded, as is the drain of transistor 1004. Similarly, the gate of transistor 1008 is grounded. The drain of transistor 1008 is connected to the source of transistor 1012. The drain of transistor 1012 is connected to the drain of transistor 1014, as well as to the gate and drain of transistor 1016. The source of transistor 1014 is grounded, as is the source of transistor 1016. The drain of transistor 1006 is connected to node 801 of programmable resistance element 800. The drain of transistor 1010 is connected to node 803 of programmable resistance element 802. As shown, a capacitor 1026 connects the drain of transistor 1006 to ground. Likewise, capacitor 1028 connects the drain of transistor 1010 to ground. An enable line 1030 is inverted by inverter 1032 and the inverted enable line 1034 is connected to the respective gates of transistors 1012 and 1014. The drain and gate of transistor 1018 are mutually connected to node 1050 of programmable resistance element 800. The source of transistor 1018 is connected to the drain of transistor 1020 and the source of transistor 1020 is grounded. The gate of transistor 1020 is connected to the enable line 1030. In similar fashion, the drain and gate of transistor 1022 are mutually connected to node 1052 of progammable resistance element 802. The source of transistor 1022 is connected to the drain of transistor 1024. The source of transistor 1024 is grounded, and the gate of transistor 1024 is connected to enable line 1030. This configuration allows transistors 1006 and 1010 to provide stable current to programmable resistance elements 808 and 802 respectively, as would be understood by one of ordinary skill in the art.

Figure 10:
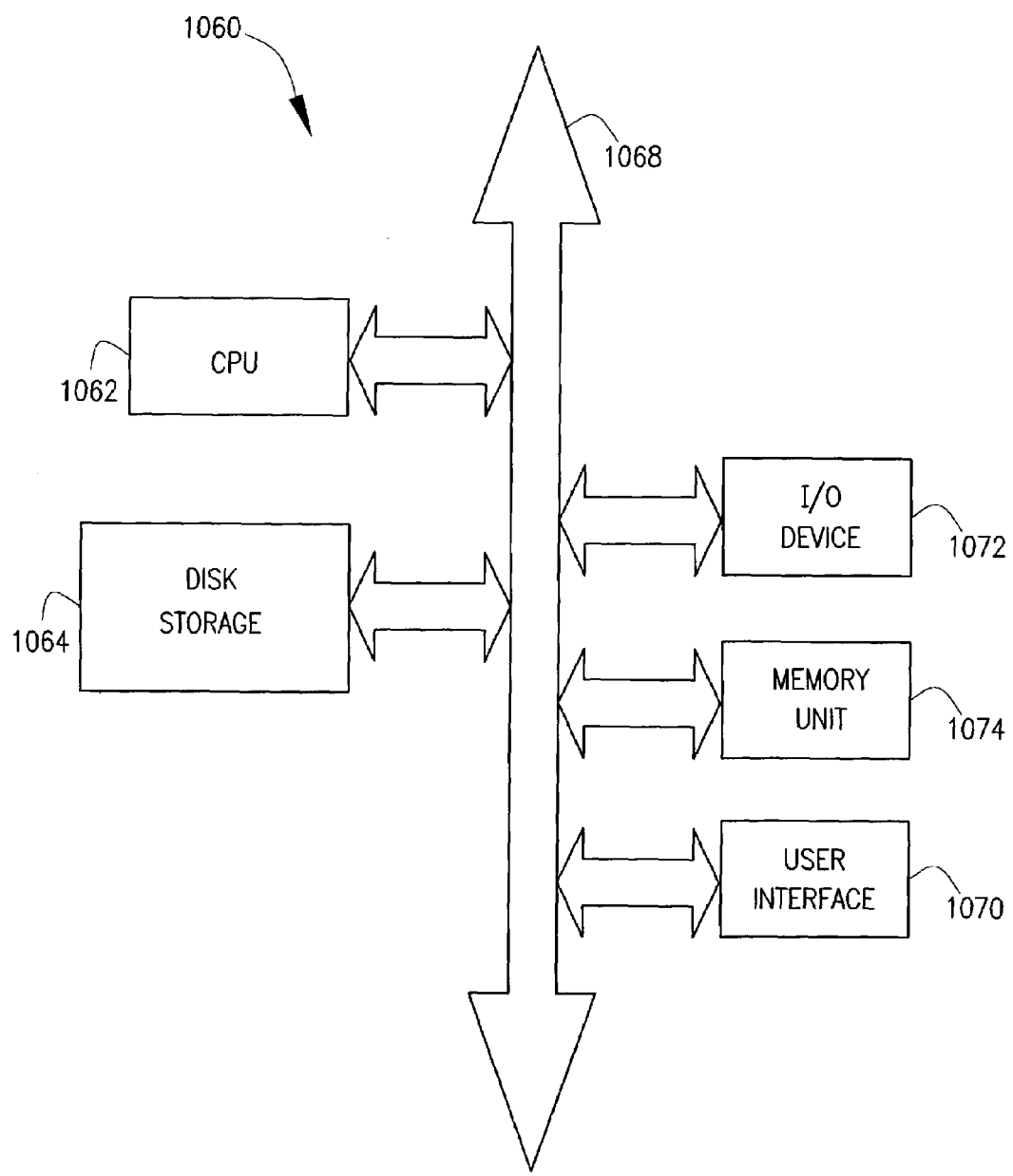
FIG. 10 shows a computer system including a memory prepared in accordance with one aspect of the invention.

FIG. 10 shows a computer system 1060 incorporating a flash memory integrated circuit according to the present invention. The system includes a CPU 1062, disk storage 1064, a data and control bus 1068, a user interface 1070, I/O 1072, and a memory unit 1074 including flash memory according to the invention. Such a system would benefit from advantages in operation of the flash memory, as discussed above.

While preferred embodiments of the invention have been described and illustrated above, it should be understood that these are exemplary of the invention and are not to be considered as limiting. Additions, deletions, substitutions, and other modifications can be made without departing from the spirit or scope of the invention. Accordingly, the invention is not to be considered as limited by the foregoing description but is only limited by the scope of the appended claims.

What is claimed as new and desired to be protected by Letters Patent of the United States is:

1. A method of controlling a power supply comprising:
reading a digital signal on a digital data bus, said digital signal including information relating to an anticipated change in power demand;
generating a control signal based on said information;
feeding said control signal forward to a power supply; and
modifying a power output of said power supply to a load in response to said control signal, wherein said power supply further comprises a plurality of charge pump circuits and a respective plurality of clock generation circuits, each of said clock circuits operatively connected to, and adapted to drive, a respective charge pump circuit,
wherein said act of modifying said power output further comprises activating more than one of said plurality of charge pump circuits in response to said control signal.

2. A method of controlling a power supply as defined in claim 1 further comprising:
enabling more than one of said plurality of clock circuits and thereby driving said respective charge pump circuit.

3. A method of controlling a power supply as defined in claim 1 wherein said digital data bus is configured as a parallel data bus.

4. A method of controlling a power supply as defined in claim 1 wherein said control signal is a digital signal.

5. A method of controlling a power supply as defined in claim 1 wherein said control signal is an analog signal.

6. A method of controlling a power supply as defined in claim 5 wherein said analog signal further comprises a voltage signal having a magnitude proportional to a multiple of data bits of a data word on said data bus having a particular state.

7. A method of controlling a power supply as defined in claim 6 wherein said multiple of data bits comprises four data bits.

8. A method of controlling a power supply as defined in claim 6 further comprising:
generating said voltage signal by flowing an electrical current through a voltage divider circuit.

9. A method of controlling a power supply as defined in claim 8 wherein said voltage divider circuit further comprises a plurality of resistors shunted by a respective plurality of transistors, each transistor being responsive to a respective data line of said data bus.

10. A method of controlling a power supply as defined in claim 1 wherein said load comprises a digital memory circuit.

11. A method of controlling a power supply as defined in claim 10 wherein said digital memory circuit further comprises a flash memory circuit.

12. A method of controlling a power supply as defined in claim 11 further comprising:
storing a portion of said digital data signal as a data word in said flash memory circuit.

13. A method of controlling a power supply comprising:
producing an analog signal related to a number of bits having a particular logic state in a digital signal, said analog signal being independent of an output of said power supply; and setting an output of said power supply to a particular level in response to said analog signal, wherein said power supply comprises a plurality of subcircuits and said setting an output of a power supply comprises activating more than one of said subcircuits, said subcircuits each including a respective charge pump circuit and wherein said activating said subcircuits further comprises, for each subcircuit, enabling a clock circuit connected to drive a respective charge pump circuit.

14. A method of controlling a power supply comprising:
sensing a number of bits in a particular logic state in a particular digital communication; and
adapting said power supply to supply a particular level of current, said level of current being proportional to said number of bits by switchingly connecting a plurality of power supply portions to a load circuit,
each power supply portion comprising a charge pump circuit and a respective clock generation circuit, each of said clock circuits operatively connected to, and adapted to drive, a respective charge pump circuit,
wherein said act of supplying a particular level of current comprises activating more than one of said plurality of power supply portions.

15. A power supply apparatus comprising:
a plurality of charge pump circuits;
a control circuit having a data input and at least one control output, said at least one control output being operatively connected to more than one of said plurality of charge pump circuits, said control circuit adapted to activate more than one of said plurality of charge pump circuits in response to a received signal on said data input containing information relating to an anticipated change in power demand.

16. A power supply apparatus comprising:
a plurality of charge pump circuits;
an input bus having a plurality of input lines;
a control circuit connected to said input bus, said control circuit adapted to provide a particular plurality of output signals in response to a number of bits of a predetermined logic value in an input signal received on said input lines containing information relating to an anticipated change in power demand;
a plurality of groups of outputs of said control circuit, each group of outputs being operatively connected to a respective charge pump circuit, said outputs being adapted to transmit said plurality of output signals to said plurality of charge pumps by their respective groups, whereby said plurality of charge pumps are each activated or deactivated in response to said respective plurality of groups of output signals.

17. A power supply controller comprising:
a plurality of data bus inputs;
a plurality of outputs;
a sensing circuit adapted to activate one or more of said plurality of outputs in response to a corresponding pattern of data bus signals detected on said plurality of data bus inputs and
a plurality of charge pump circuits connected to one of said plurality of outputs, said plurality of charge pump circuits being adapted to modify said power output by activating more than one of said plurality of charge pump circuits.

18. A processing system comprising:
a microprocessor;
a data bus, said data bus connected to said microprocessor;
an electronic memory device having a plurality of data bus inputs connected to said data bus, said electronic memory device including a power supply controller having a plurality of outputs and a sensing circuit adapted to activate more than one of the plurality of outputs in response to a pattern of data bus signals detected on said plurality of data bus inputs and
a plurality of charge pump circuits each operatively connected to a respective output.

19. A microprocessor integrated circuit comprising:
a processing portion;
a memory portion connected to said processing portion by a data bus portion, said memory portion including a power supply and power supply controller, said power supply controller having a plurality of data bus inputs connected to said data bus portion, an output connected to said power supply, and a sensing circuit adapted to activate or deactivate said output in response to a corresponding pattern of data bus signals detected on said plurality of data bus inputs; and
a plurality of charge pump circuits responsive to said output, said output activating more than one of said plurality of charge pump circuits responsive to said sensing circuit.

* * * * *